United States Patent
Parascandola et al.

(10) Patent No.: US 7,291,560 B2
(45) Date of Patent: Nov. 6, 2007

(54) METHOD OF PRODUCTION PITCH FRACTIONIZATIONS IN SEMICONDUCTOR TECHNOLOGY

(75) Inventors: Stefano Parascandola, Dresden (DE); Dirk Caspary, Dresden (DE)

(73) Assignee: Infineon Technologies AG, Munich (DE)

( * ) Notice: Subject to any disclaimer, the term of this patent is extended or adjusted under 35 U.S.C. 154(b) by 157 days.

(21) Appl. No.: 11/194,489

(22) Filed: Aug. 1, 2005

(65) Prior Publication Data

US 2007/0026684 A1  Feb. 1, 2007

(51) Int. Cl.
*H01L 21/70* (2006.01)
(52) U.S. Cl. .............. 438/689; 438/733; 438/694; 216/41
(58) Field of Classification Search .......... 438/689
See application file for complete search history.

(56) References Cited

U.S. PATENT DOCUMENTS

| | | |
|---|---|---|
| 5,296,410 A | 3/1994 | Yang |
| 6,063,688 A | 5/2000 | Doyle et al. |
| 6,121,123 A * | 9/2000 | Lyons et al. ............. 438/585 |
| 6,133,132 A * | 10/2000 | Toprac et al. ............. 438/595 |
| 6,180,468 B1 * | 1/2001 | Yu et al. .................. 438/297 |
| 6,248,637 B1 * | 6/2001 | Yu ........................... 438/300 |
| 6,429,123 B1 | 8/2002 | Tseng |
| 6,667,237 B1 | 12/2003 | Metzler |
| 2003/0127426 A1 | 7/2003 | Chang et al. |
| 2003/0141276 A1 * | 7/2003 | Lee ........................... 216/8 |

OTHER PUBLICATIONS

Runbin (Computer Aids for VLSI Design © 1984).*

* cited by examiner

*Primary Examiner*—Duy-Vu N. Deo
*Assistant Examiner*—Patricia A. George
(74) *Attorney, Agent, or Firm*—Slater & Matsil, L.L.P.

(57) ABSTRACT

Spacers are formed on sidewalls of striplike parts of a pattern layer of periodic structure. The pattern layer is removed, and the spacers are covered with a further spacer layer, which is then structured to second sidewall spacers. Gaps between the spacers are filled with a complementary layer. The upper surface is planarized to a lower surface level, leaving a periodic succession of the first spacers, the second spacers and the residual parts of the complementary layer. The lateral dimensions are adapted in such a manner that a removal of one or two of the remaining layers renders a periodic pattern of smaller pitch.

28 Claims, 5 Drawing Sheets

METHOD OF PRODUCTION PITCH FRACTIONIZATIONS IN SEMICONDUCTOR TECHNOLOGY

TECHNICAL FIELD

This invention concerns production methods of periodic structures or patterns of semiconductor devices.

BACKGROUND

Certain types of semiconductor devices like semiconductor memories comprise structure elements or patterned layers that are periodic at least in one dimension. Word lines and bit lines, for example, are often arranged along straight lines running parallel to one another. The width of the lines and the distance between neighboring lines are constant all over the device. Thus, the succession of the lines in one direction is periodic, preferably of minimal dimensions, which enables to realize a memory cell array of minimal area. The dimensions of the lines and their interspaces are continually repeated in the direction of the periodic succession. The length of one of these periods is called the pitch of the pattern.

The value of the pitch is restricted by the production technology that is applied to structure the periodic pattern. Some limitations are due to the mask technique that is employed in the structuring process. In the usual etching processes using masks, there are lower limits to the dimensions that can be obtained. The further miniaturization of the devices, on the other hand, necessitates the provision of production methods by which smaller pitches can be realized. These methods are only applicable if the structures that are produced are sufficiently precise to meet the requirements of the device performance.

SUMMARY OF THE INVENTION

In one aspect, this invention concerns a production method of periodic patterns in semiconductor devices having a smaller pitch than has heretofore been possible.

In a further aspect, the invention decreases the pitch by method steps that are based on standard semiconductor technology.

The preferred embodiment of the invention makes use of repeated spacer technology to substitute a regular, periodic pattern with smaller and more narrowly spaced elements, which renders a fractionization of the pitch. A substrate is provided with a pattern layer that is structured in separate striplike parts running parallel to one another and having the same lateral dimension and the same distance between them. A first spacer layer is applied conformally on the pattern layer. The first spacer layer is etched anisotropically to form first spacers on the sidewalls of the striplike parts. The pattern layer is removed, leaving the first spacers with two main sidewalls each. A second spacer layer is applied conformally. The second spacer layer is etched anisotropically to form second spacers on the main sidewalls of the first spacers so that free spaces remain between neighboring second spacers. A complementary layer is applied to fill these free spaces. A planar surface is formed of upper surfaces of the first spacers, the second spacers and the complementary layer. Either the first spacers, or the second spacers, or the complementary layer, or both the first and the second spacers, or both the first spacers and the complementary layer, or both the second spacers and the complementary layer are removed.

These and other features and advantages of the invention will become apparent from the following brief description of the drawings, detailed description and appended claims and drawings.

BRIEF DESCRIPTION OF THE DRAWINGS

For a more complete understanding of the present invention, and the advantages thereof, reference is now made to the following descriptions taken in conjunction with the accompanying drawings, in which.

The following list of reference symbols can be used in conjunction with the figures:

1 substrate
2 pattern layer
3 hard mask
4 first spacer layer
5 first spacer 6 second spacer layer
7 second spacer
8 complementary layer
9 device layers
10 original pitch

DETAILED DESCRIPTION OF ILLUSTRATIVE EMBODIMENTS

Figure 1:
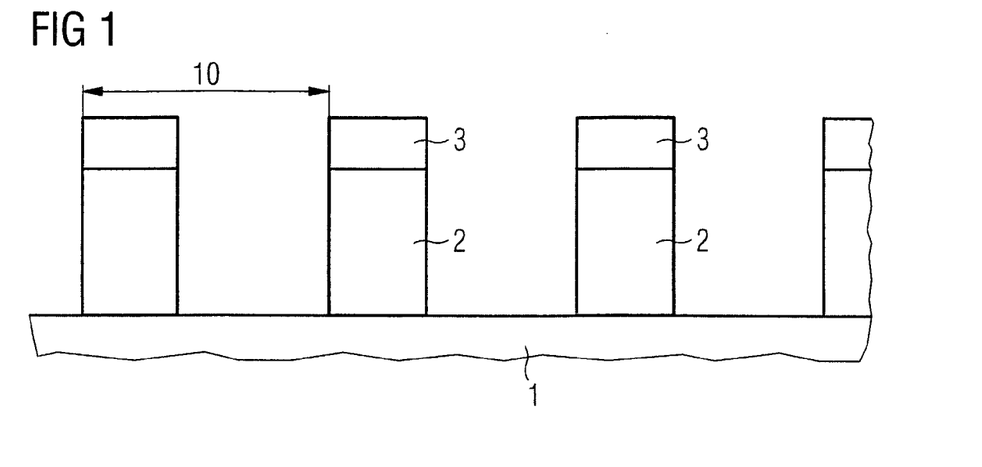
FIG. 1 shows a cross-section of a first intermediate product of a first variant of the inventive method.

FIG. 1 shows a cross-section of a first intermediate product of a first variant of the method. A pattern layer 2 is applied on a main surface of a substrate 1, which may also comprise layers of different materials or semiconductor device structures. This is not shown in detail in FIG. 1, since it is not essential for the method to be described. The pattern layer 2 is provided with a structure of separate striplike parts running parallel to one another. This structure can be obtained by means of a hard mask 3. The hard mask 3 can be nitride, for example, which can be structured by a photolithography step including the application of a photo resist layer. The striplike parts of the pattern layer 2 have sidewalls, which are ideally perpendicular to the main surface of the substrate.

The lateral dimensions of the striplike parts, their widths, are the same throughout. The distances between two neighboring striplike parts are also the same for all pairs of neighboring parts. Therefore, the pattern layer 2 has a periodic structure, each period encompassing one striplike part and one interspace between two neighboring striplike parts. The length of the period is indicated in FIG. 1 as the original pitch 10 of the pattern. Of course, the section representing the periodicity can be shifted in either direction of the arrows in FIG. 1, but the length of the period is fixed and defines the pitch of the pattern. The hard mask 3 is preferably removed before the next process steps are performed.

Figure 2:
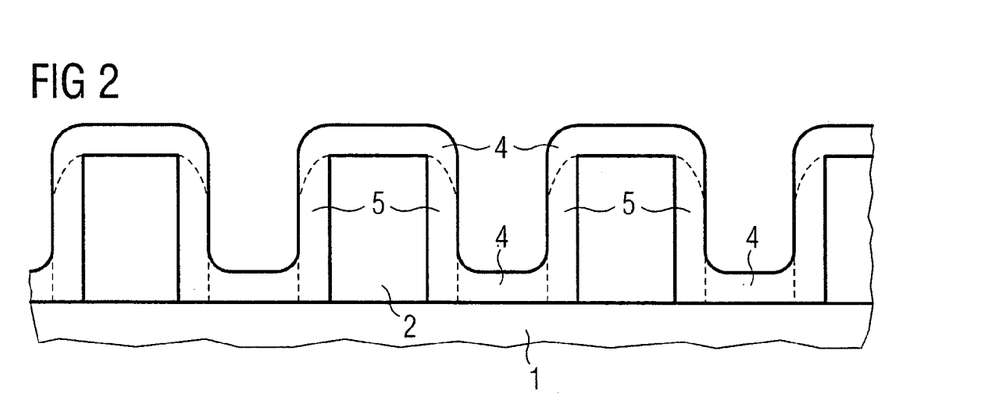
FIG. 2 shows a cross-section according to FIG. 1 of a further intermediate product after the application of a spacer layer.

FIG. 2 shows a further intermediate product after a conformal application of a first spacer layer 4. The material of the first spacer layer 4 can be electrically insulating or electrically conductive and is selected to be different from the material of the pattern layer 2 so that the pattern layer 2 can be removed selectively to the first spacer layer 4. The shape of first spacers 5, which are to be formed of the first spacer layer 4, is indicated in FIG. 2 by broken lines. The first spacers 5 are produced by an anisotropic etching step, which reduces the first spacer layer 4 in a direction perpendicular to the main surface of the substrate 1. This process proceeds until the material of the first spacer layer 4 is completely removed above the pattern layer 2 and in the regions between the first spacers 5 to be produced. Then the pattern layer 2 is removed.

Figure 3:
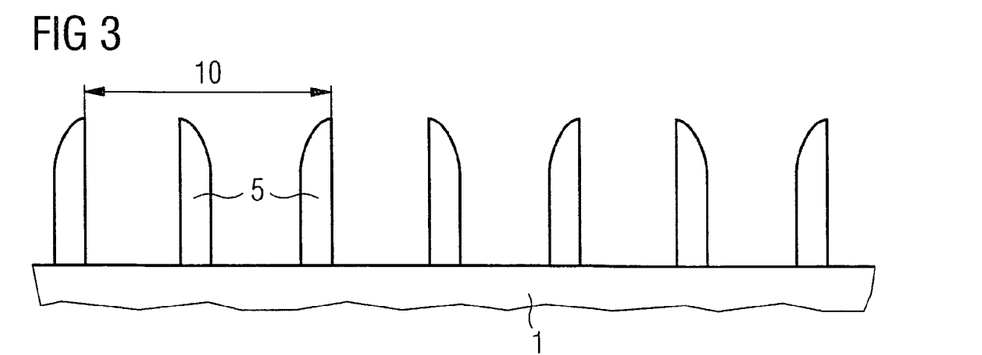
FIG. 3 shows a cross-section according to FIG. 2 after the spacer formation.

FIG. 3 shows the cross-section according to FIG. 2 after the removal of the pattern layer 2. The first spacers 5 are left on the substrate 1 and form a new periodic pattern, neighboring first spacers 5 being spaced apart from one another. The original pitch 10 is also indicated in FIG. 3. There are two first spacers 5 in every period of the original pitch 10. In the embodiment shown in FIG. 3, the lateral dimensions of the striplike parts of the pattern layer 2 and the lateral dimension or thickness of the first spacers 5 have been chosen so that the first spacers 5 are equally spaced apart. In this way, a periodic new pattern is obtained, which has a pitch that is one half of the original pitch 10.

Figure 4:
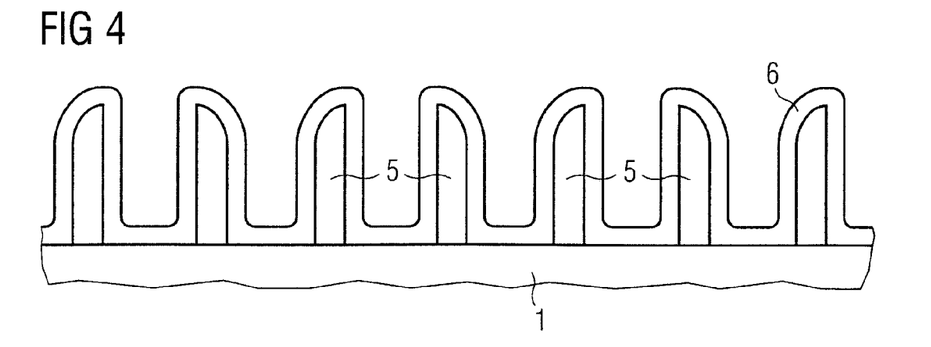
FIG. 4 shows a cross-section according to FIG. 3 after the application of a second spacer layer.

FIG. 4 shows the cross-section according to FIG. 3 after the application of a second spacer layer 6, which can be any material, especially a liner, for example. It is also applied conformally so that second spacers are left after a subsequent anisotropic etching. This renders a structure of first spacers 5 and second spacers 7 as shown in FIG. 5.

Figure 5:
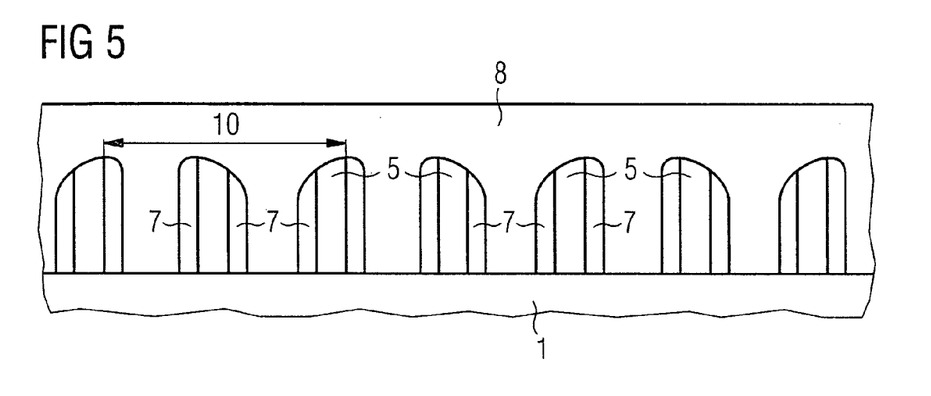
FIG. 5 shows a cross-section according to FIG. 4 after the production of second spacers and the application of a complementary layer.

FIG. 5 shows that the first spacers 5, whose height may have been slightly reduced in the course of the second etching step, are now provided with second spacers 7 on both opposite main sidewalls. The original pitch 10 is again indicated in FIG. 5. The obtained structure is covered with a complementary layer 8, which fills the gaps between the spacers. The material of the complementary layer 8 is selected according to the requirements of the embodiment of the semiconductor device and also in view of the subsequent structuring step.

Figure 6:
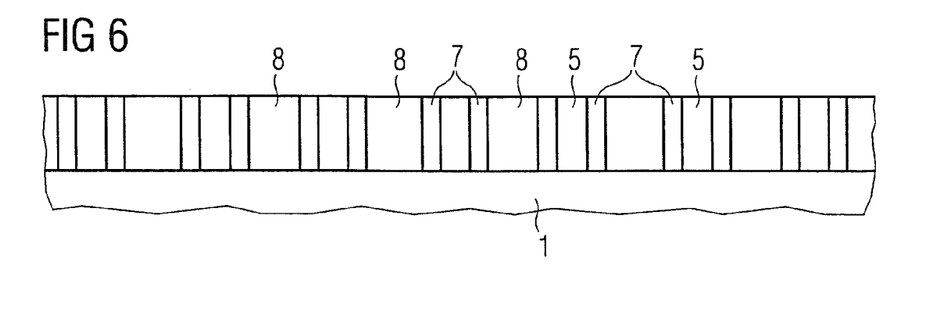
FIG. 6 shows a cross-section according to FIG. 5 after a planarizing step.

The upper surface of the intermediate product according to FIG. 5 is then planarized and preferably polished down to the typical level shown in FIG. 6, which also shows the order of succession of a striplike residual part of the complementary layer 8, a second spacer 7, a first spacer 5, and a second spacer 7, and so on periodically in the direction perpendicular to the longitudinal extension of the layer strips. In order to obtain a periodic pattern of half the original pitch, the first and second spacers are removed.

Figure 7:
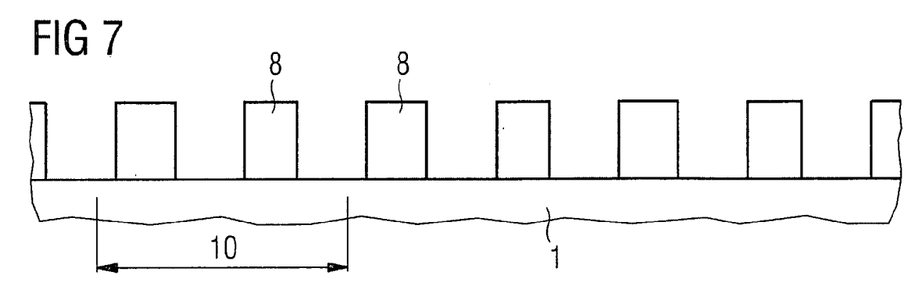
FIG. 7 shows a cross-section according to FIG. 6 after the removal of the spacers, in order to form a periodic pattern of half pitch.

FIG. 7 shows the product after the removal of the spacers, leaving only the striplike residual parts of the complementary layer 8. The original pitch 10 is indicated in FIG. 7 to show that the pitch has been halved by the previous method steps.

Figure 8:
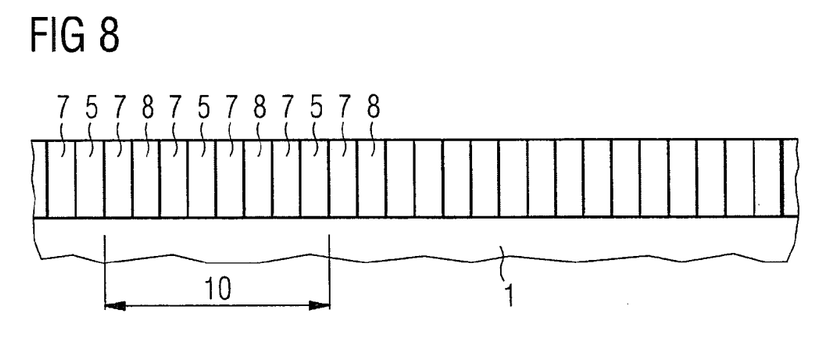
FIG. 8 shows a cross-section according to FIG. 6 of a variant of the method comprising different dimensions.

FIG. 8 shows the intermediate product according to the cross-section of FIG. 6 of a variant of the method comprising other lateral dimensions. Here, the dimensions of the striplike parts of the pattern layer 2 and the thicknesses of the first spacers 5 and the second spacers 7 have been adjusted so that the strips of the first spacers, the second spacers, and the residual parts of the complementary layer 8 all have the same lateral dimensions. It is sufficient if at least the lateral dimensions of the parts of the complementary layer 8 and the first spacers 5 are the same.

This ensures that both the succession of the second spacers 7 and the alternating succession of the first spacers 5 and the parts of the complementary layer 8 form a periodic pattern of a quarter of the original pitch 10.

Figure 9:
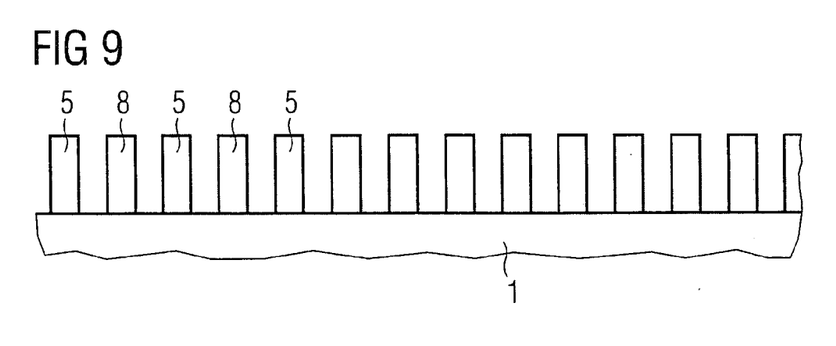
FIG. 9 shows a cross-section according to FIG. 7 of a product that can be obtained from the intermediate product of FIG. 8.

FIG. 9 shows the example of a periodic pattern of one quarter of the original pitch 10, which is obtained if the second spacers 7 are removed. A complementary periodic pattern consisting of the second spacers 7 is produced if both the first spacers 5 and the portions of the complementary layer 8 are removed. Various other periodic patterns can be obtained by the removal of any single layer or combination of layers present in the intermediate product according to FIG. 8. Thus, different patterns are obtained by the removal of either only the first spacers 5, or only the second spacers 7, or only the complementary layer 8, or both first and second spacers, or both first spacers and complementary layer, or both second spacers and complementary layer.

Figure 10:
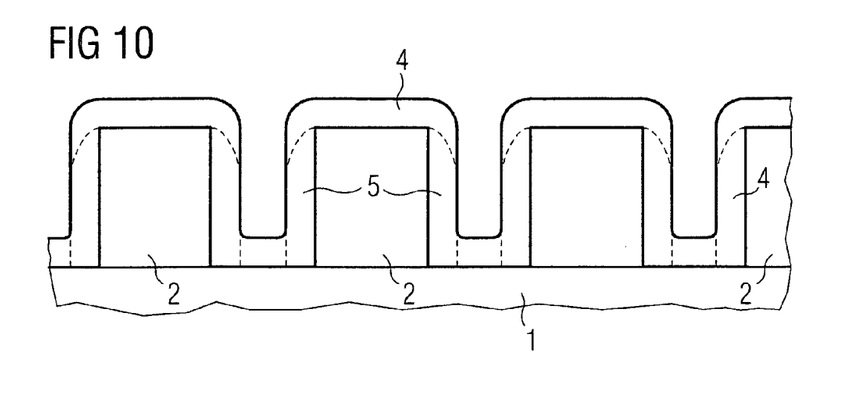
FIG. 10 shows a cross-section according to FIG. 2 of a variant of the method comprising other lateral dimensions.

FIG. 10 shows a cross-section of a further embodiment of an intermediate product according to the cross-section of FIG. 2. The embodiment of FIG. 10 differs from the embodiment of FIG. 2 by the lateral dimension of the striplike parts of the pattern layer 2. This dimension is here chosen to be greater than twice the distance between every two first spacers 5 that are located on the sidewalls of two neighboring striplike parts facing one another.

Figure 11:
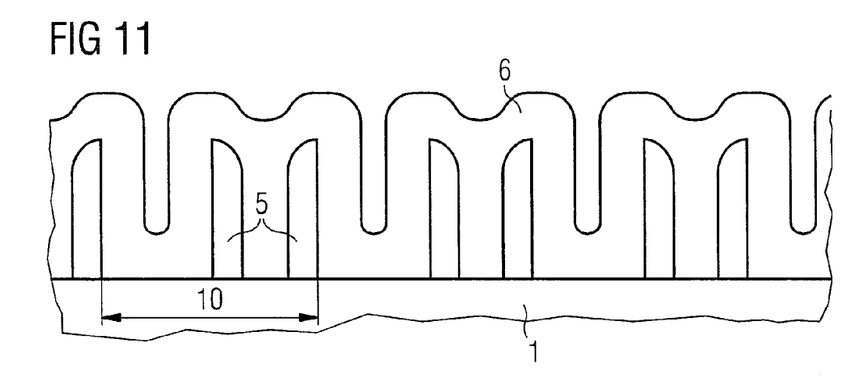
FIG. 11 shows a cross-section according to FIG. 10 of a further intermediate product after the application of a second spacer layer.

FIG. 11 shows the cross-section according to FIG. 10 of a further intermediate product after the application of the second spacer layer 6. The distances between the first spacers 5 are alternatingly large and small in the succession of the first spacers. The smaller gaps between the first spacers 5 are completely filled with the material of the second spacer layer 6. In the larger gaps, there are small interstices between the sidewall sections of the conformally deposited second spacer layer 6.

Figure 12:
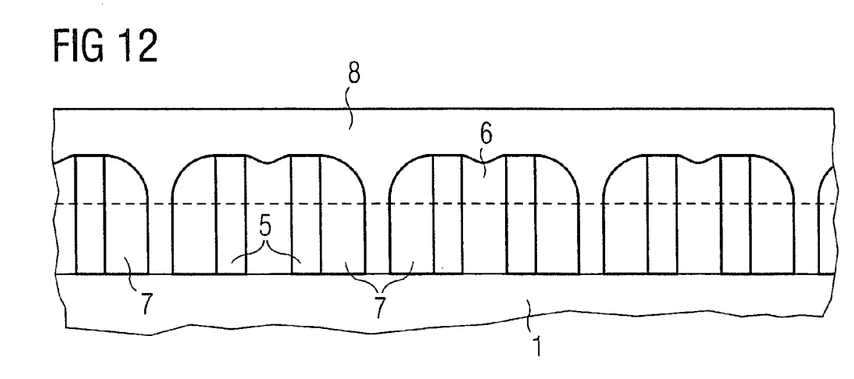
FIG. 12 shows a cross-section according to FIG. 11 after the formation of second spacers and the application of a complementary layer.

FIG. 12 shows the cross-section according to FIG. 11 after the formation of the second spacers 7. The thickness of the second spacer layer 6 is preferably chosen so that the interstices left between neighboring second spacers 7 have the same dimension as the first spacers 5. If the lateral dimension of the striplike parts of the pattern layer 2 is also appropriately chosen, the thickness of the residual parts of the second spacer layer 6 that are located within the narrower gaps between the first spacers 5 and the thickness of the second spacers 7 are equal. In this case, all the residual parts of the second spacer layer 6 are spaced apart at equal distances. A subsequent planarization step, by which the materials are removed down to the level that is indicated by the horizontal broken line in FIG. 12, will render a structure similar to the structure shown in FIG. 8, but with comparably thicker second spacers 7. The comparison with FIG. 11 shows that this variant renders a periodic pattern of second spacers 7 in which there are always three second spacers 7 within the space of the original pitch 10. Therefore, the new pitch is one third of the original pitch.

Figure 13:
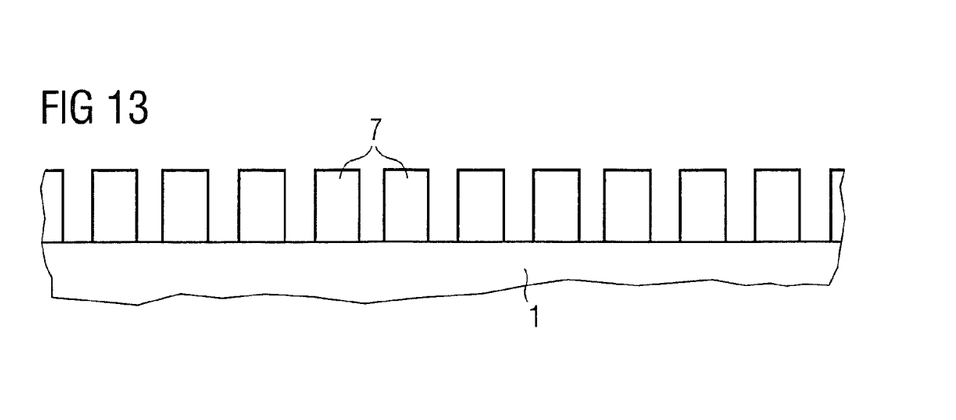
FIG. 13 shows a cross-section according to FIG. 7 of a product that is obtainable from the intermediate product according to FIG. 12.

FIG. 13 shows a further intermediate product after the removal of the first spacers 5 and the complementary layer 8. The remaining second spacers 7 all have the same width and are equally spaced apart.

Figure 14:
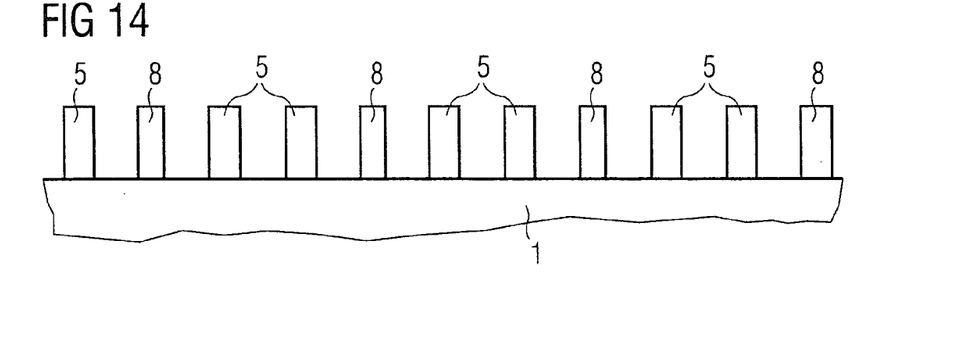
FIG. 14 shows a cross-section according to FIG. 13 of a further product that is obtainable from the intermediate product according to FIG. 12.

FIG. 14 shows a complementary structure, in which the second spacers 7 have been removed and the first spacers 5 and the complementary layer 8 have been left on the substrate 1. Since the dimensions are adjusted so that the first spacers 5 and the parts of the complementary layer 8 have the same thickness, the structure of the product according to FIG. 14 has a periodic pattern of one third of the original pitch 10.

Figure 15:
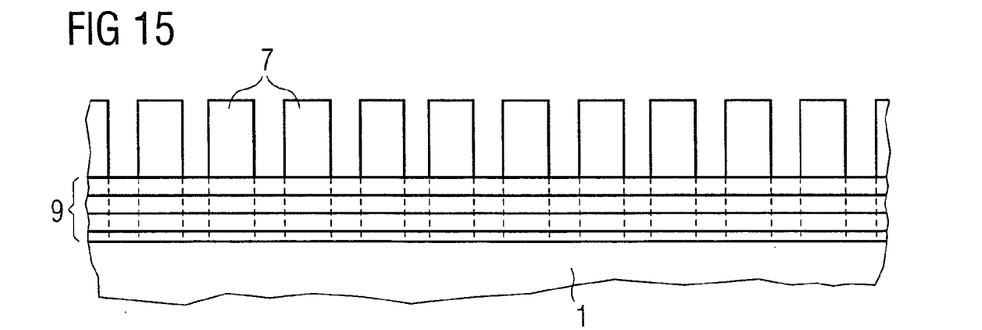
FIG. 15 shows a cross-section of an intermediate product according to a further application of the method.

FIG. 15 shows the product according to FIG. 13 with further device layers 9 indicated between the pattern of the second spacers 7 and the substrate 1. This example demonstrates that the pattern of fractionized original pitch, which is obtained by this method, can be used as a mask to structure further device layers 9 to periodic patterns of smaller pitch than has heretofore been possible. In this example, the second spacers 7 are preferably formed of a material that is suitable for hard masks, for example silicon nitride. In the same way, the patterns of FIG. 7, FIG. 9 or FIG. 14 as well as the other regular patterns that can be obtained by this method can be used as a mask in further structuring steps, by which device layers 9 are structured with smaller pitch. The device layers 9 can especially be word line layers comprising a gate dielectric, especially one including a memory layer, a polysilicon layer, a metal or metal silicide layer and a top electrically insulating layer, which are structured into word line stacks. But possible applications of the pitch fractionization by this method are not limited to memory devices.

Although the present invention and its advantages have been described in detail, it should be understood that various changes, substitutions and alterations can be made herein without departing from the spirit and scope of the invention as defined by the appended claims.

What is claimed is:

1. A method of forming a semiconductor device, the method comprising:

provinding a substrate with a pattern layer that is structured in separate striplike parts running parallel to one another, said striplike parts having sidewalls and lateral dimensions which are the same for each one of said parts, said striplike parts being arranged at a distance from one another, said distance being the same for every two neighboring ones of said portions;

applying a first spacer layer conformally on said patter layer;

etching said first spacer layer anisotropically to form first spacers on said sidewalls of said striplike parts;

removing said pattern layer, leaving said first spacers with two main sidewalls each;

applying a second spacer layer conformally;

etching said second spacer layer anisotronically to form second spacers on said sidewalls of said first spacers so that free spaces remain between pairs of said second spacers that are located on sidewalls that face one another;

applying a complementary layer to fill said free spaces;

planarizing upper surfaces of said first spacers, said second spacers and said complementary layer;

removing at least one layer selected from the group consisting of first spacers, second spacers, complementary layer, both first and second spacers, both first spacers and complementary layer, and both second spacers and complementary layer; and using at least one remaining layer selected from the group consisting of both second spacers and complementary layer, both first spacers and complementary layer, both first and second spacers, complementary layer, second spacers, and first spacers as a mask to etch a further layer or layer sequence located underneath into striplike parts.

2. A method of forming a semiconductor device, the method comprising:

forming a plurality of structures over a substrate;

forming first spacers along sidewalls of the structures;

removing said structures thereby leaving the first spacers;

forming second spacers along sidewalls of the first spacers;

forming complementary layer to fill free spaces between ones of the second spacers;

removing at least one of the first spacers, the second spacers, or the complementary layer; and planarizing upper surfaces of the first spacers, the second spacers and said complementary layer prior to removing at least one of the first spacers, the second spacers or the complementary layer.

3. A method of forming a semiconductor device, the method comprising:

forming a plurality of structures over a substrate;

forming first spacers along sidewalls of the structures;

removing said structures thereby leaving the first spacers;

forming second spacers along sidewalls of the first spacers;

forming a complementary layer to fill free spaces between ones of the second spacers;

removing at least one of the first spacers, the second spacers, or the complementary layer; and using a remaining structure as a mask to etch a further layer beneath the remaining structure subsequent to said step of removing at least one of the first spacers, the second spacers, or the complementary layer, the remaining structure comprising at least one of the first spacers, second spacers or complementary layer that were not removed.

4. A method of forming a semiconductor device, the method comprising:

forming first a plurality of parallel striplike structures over a substrate, each structure having a first width and adjacent over of said striplike structures being spaced apart by a first distance such that said striplike structure define a first pitch;

forming first spacers along sidewalls of the parallel structures, each of the first spacers having a thickness that is equal to one half of the difference between the first distance and the first width;

removing the structures thereby leaving the spacers with two exposed sidewalls each;

forming second spacers along said exposed two sidewalls of the first spacers;

forming a complementary layer to fill free spaces between ones of the second spacers to form parallel strips of said complementary layer; and removing at least one of, but not all three of the first spacers, the second spacers, or the parallel strips of the complementary layer to form a second plurality of equally spaced parallel striplike structures having a second pitch that is a fractionalized portion of the first pitch.

5. The method according to claim 4, wherein removing at least one of the first spacers, the second spacers, or the parallel strips of the complementary layer comprises removing only beth the first spacers and the second spacers such tat the parallel strips of the complementary layer remain, the parallel strips of the complementary layer having a pitch that is about one half of the pitch of the first plurality of the striplike structures.

6. The method of claim 4, wherein said second pitch is ¼ of said first pitch.

7. The method of claim 4, wherein said second pitch is ⅓ of said first pitch.

8. A method of forming a semiconductor device, the method comprising:

forming a plurality of equally spaced parallel structures over a substrate said parallel structures defining a first pitch;

forming first spacers along sidewalls of the parallel structures;

removing said parallel structures thereby leaving the first spacers with two exposed sidewalls each;

forming second spacers along said exposed sidewalls of the first spacers;

forming a complementary layer to fill free spaces between ones of the second spacers; and removing at least one of, but not all three of the first spacers, the second spacers, or the complementary layer to form a second plurality of equally spaced parallel structures having a second pitch that is a fractionalized portion of the first pitch.

9. The method of claim 8, further comprising planarizing upper surfaces of the first spacers, the second spacers and said complementary layer prior to removing at least one of the first spacers, the second spacers or the complementary layer.

10. The method of claim 8, wherein forming a plurality of structures comprises performing a photolithography process.

11. The method of claim 8, further comprising, after removing at least one of the first spacers, the second spacers, or the complementary layer, using a remaining structure as a mask to etch a further layer beneath the remaining structure, the remaining stricture comprising at least one of the first spacers, second spacers or complementary layer that were not removed.

12. The method of claim 8, wherein said second pitch is ¼ of said first pitch.

13. The method of claim 8, wherein said second pitch is ⅓ of said first pitch.

14. A method of forming a semiconductor device, the method comprising:

providing a substrate with a first pattern layer that is structured in separate striplike parts running parallel to one another, said striplike parts having sidewalls and lateral dimensions which are the same for each one of said parts, said striplike parts being arranged at a distance from one another, said distance being the same for every two neighboring ones of said portions such that said striplike parts define a first pitch;

applying a first spacer layer conformally on said pattern layer;

etching said first spacer layer anisotropically to form first spacers on said sidewalls of said striplike parts;

removing said pattern layer, leaving said first spacers with two exposed sidewalls each;

applying a second spacer layer conformally over said first spacers;

etching said second spacer layer anisotropically to form second spacers on said sidewalls of said first spacers so that free spaces remain between pairs of said second spacers that are located on sidewalls that face one another;

applying a complementary layer to fill said free spaces;

planarizing upper surfaces of said first spacers, said second spacers and said complementary layer to form parallel strips of said complementary layer; and removing at least one layer of, but not all three of the first spacers, second spacers, and the parallel strips of the complementary layer, or both first and second spacers, but not the parallel strips of the complementary layer, or both first spacers and the strips of the complementary layer, but not the second spacers, or both second spacers and the strips of the complementary layer but not the first spacers, to form a second pattern of separate striplike parts having a second pitch that is a fractionalized portion of the first pitch.

15. The method according to claim 14, wherein the step of removing at least one of, but not all three comprises removing said first spacers.

16. The method according to claim 14, wherein the step of removing at least one of, but not all three comprises removing said second spacers.

17. The method according to claim 14, wherein the step of removing at least one of, but not all three comprises removing said strips of the complementary layer.

18. The method according to claim 14, wherein removing at least one layer comprises removing both said first spacers and said second spacers.

19. The method according to claim 14, wherein removing at least one layer comprises removing both said first spacers and said complementary layer.

20. The method according to claim 14, wherein removing at least one layer comprises removing both said second spacers and said complementary layer.

21. The method of claim 14, wherein said second pitch is ¼ of said first pitch.

22. The method of claim 14, wherein said second pitch is ⅓ of said first pitch.

23. The method according to claim 14, wherein said first spacers and said second spacers are formed so that said second spacers are spaced apart at equal distances.

24. The method according to claim 23, wherein said second spacers are separated successively alternatingly by one of said first spacers and by said complementary layer.

25. The method according to claim 14, wherein said striplike parts of said pattern layer and said first spacers are formed in such a manner that the distance between first spacers that are formed between two neighboring striplike parts of said pattern layer is less than one half of the lateral dimension of the striplike parts; and
wherein said second spacers are formed to be equally spaced apart and to have a lateral dimension equal to the distance between first spacers that are formed between two neighboring striplike parts of said pattern layer.

26. The method according to claim 25, wherein said second spacers are separated successively in periodic fashion once by said complementary layer and twice by said first spacers.

27. The method according to claim 14, wherein providing a substrate with a first pattern layer comprises:
forming a layer of material ova the substrate;
forming a resist layer over the layer of material;
patterning the resist layer using a photolithographic mask; and
forming the separate striplike parts in alignment with the patterned resist layer.

28. The method according to claim 27, further comprising patterning a hard mask layer after patterning the resist layer, where forming the separate striplike parts comprises, etching the layer of material using the patterned hard mask layer as a mask.

* * * * *

UNITED STATES PATENT AND TRADEMARK OFFICE
CERTIFICATE OF CORRECTION

PATENT NO. : 7,291,560 B2 Page 1 of 1
APPLICATION NO. : 11/194489
DATED : November 6, 2007
INVENTOR(S) : Parascandola et al.

It is certified that error appears in the above-identified patent and that said Letters Patent is hereby corrected as shown below:

Title Page:
In the Title Item (54), delete "PRODUCTION" and insert --PRODUCING--.
In Col. 1, line 1, delete "PRODUCTION" and insert --PRODUCING--.
In Col. 4, line 46 and 47, remove paragraph return after "same." in paragraph 5 to append paragraph 6 to the end of paragraph 5.
In Col. 6, line 23, delete "patter" and insert --pattern--.
In Col. 6, line 30, delete "anisotronically" and insert --anisotropically--.
In Col. 6, line 58, delete "forming" and insert --forming a--.
In Col. 7, line 44, delete "beth".
In Col. 7, line 45, delete "tat" and insert --that--.
In Col. 8, line 16, delete "stricture" and insert --structure--.
In Col. 10, line 14, delete "ova" and insert --over--.
In Col. 10, line 22, delete "comprises," and insert --comprises--.

Signed and Sealed this

Twenty-fifth Day of March, 2008

JON W. DUDAS
*Director of the United States Patent and Trademark Office*